(12) United States Patent
Vashchenko

(10) Patent No.: US 8,319,255 B2
(45) Date of Patent: Nov. 27, 2012

(54) LOW SIDE ZENER REFERENCE VOLTAGE EXTENDED DRAIN SCR CLAMPS

(75) Inventor: Vladislav Vashchenko, Palo Alto, CA (US)

(73) Assignee: Texas Instruments Incorporated, Dallas, TX (US)

( * ) Notice: Subject to any disclaimer, the term of this patent is extended or adjusted under 35 U.S.C. 154(b) by 474 days.

(21) Appl. No.: 12/798,271

(22) Filed: Apr. 1, 2010

(65) Prior Publication Data

US 2011/0241069 A1 Oct. 6, 2011

(51) Int. Cl.
*H01L 29/66* (2006.01)
(52) U.S. Cl. ........ 257/140; 257/343; 257/355; 257/342; 257/341; 257/338
(58) Field of Classification Search .................. None
See application file for complete search history.

(56) References Cited

U.S. PATENT DOCUMENTS

| | | | |
|---|---|---|---|
| 5,736,766 A * | 4/1998 | Efland et al. | 257/338 |
| 5,767,546 A * | 6/1998 | Williams et al. | 257/343 |
| 6,137,140 A * | 10/2000 | Efland et al. | 257/343 |
| 6,144,070 A * | 11/2000 | Devore et al. | 257/343 |
| 6,211,551 B1 * | 4/2001 | Suzumura et al. | 257/343 |
| 6,512,268 B1 * | 1/2003 | Ueno | 257/341 |
| 6,576,958 B2 * | 6/2003 | Ker et al. | 257/355 |
| 6,593,621 B2 * | 7/2003 | Tsuchiko et al. | 257/335 |
| 6,605,844 B2 * | 8/2003 | Nakamura et al. | 257/360 |
| 6,614,077 B2 * | 9/2003 | Nakamura et al. | 257/355 |
| 7,812,392 B2 * | 10/2010 | Saito et al. | 257/329 |
| 8,008,687 B2 * | 8/2011 | Tu et al. | 257/119 |
| 2003/0209774 A1 * | 11/2003 | Jimbo et al. | 257/488 |
| 2006/0043487 A1 * | 3/2006 | Pauletti et al. | 257/355 |
| 2007/0037355 A1 * | 2/2007 | Lee et al. | 438/309 |
| 2008/0179671 A1 * | 7/2008 | Saito et al. | 257/341 |
| 2008/0296669 A1 * | 12/2008 | Pendharkar et al. | 257/329 |
| 2008/0315299 A1 * | 12/2008 | Saito et al. | 257/329 |
| 2009/0020814 A1 * | 1/2009 | Choi et al. | 257/343 |
| 2009/0096022 A1 * | 4/2009 | Chang et al. | 257/343 |
| 2009/0315113 A1 * | 12/2009 | Vashchenko | 257/355 |
| 2010/0006933 A1 * | 1/2010 | Huang et al. | 257/336 |
| 2010/0006935 A1 * | 1/2010 | Huang et al. | 257/341 |
| 2011/0140201 A1 * | 6/2011 | Lin et al. | 257/342 |
| 2011/0241069 A1 * | 10/2011 | Vashchenko | 257/140 |

* cited by examiner

*Primary Examiner* — Julio J Maldonado
*Assistant Examiner* — Shantanu C Pathak
(74) *Attorney, Agent, or Firm* — Alan A. R. Cooper; Wade James Brady, III; Frederick J. Telecky, Jr.

(57) ABSTRACT

In an ultra high voltage lateral DMOS-type device (UHV LDMOS device), a central pad that defines the drain region is surrounded by a racetrack-shaped source region with striations of alternating n-type and p-type material radiating outwardly from the pad to the source to provide for an adjustable snapback voltage.

14 Claims, 3 Drawing Sheets

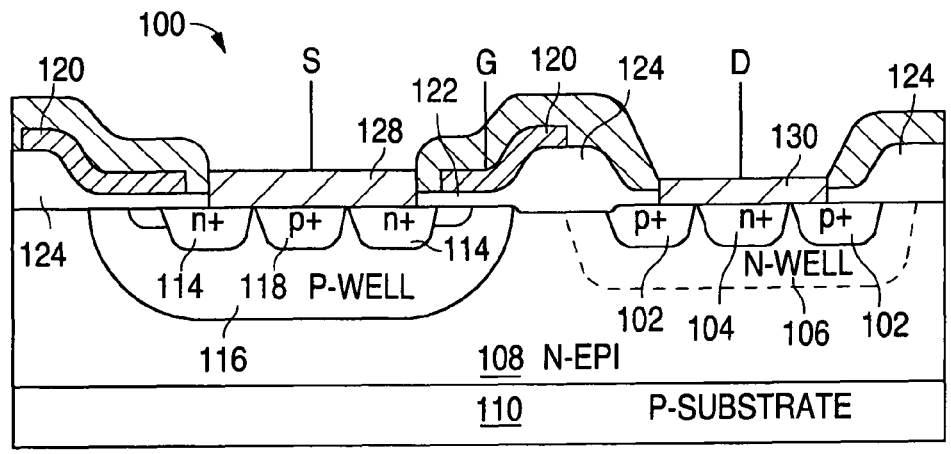
FIG. 1
(PRIOR ART)
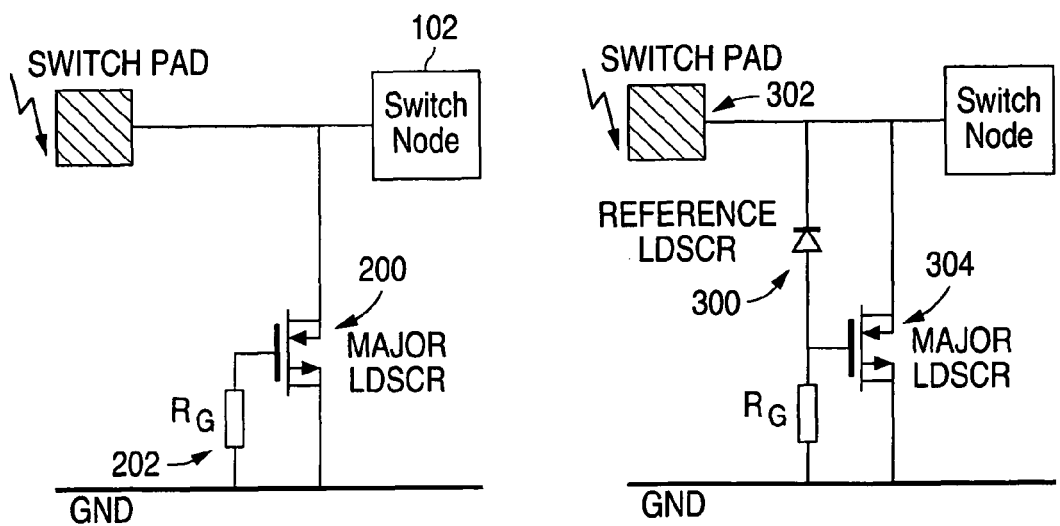
FIG. 2
(PRIOR ART)
FIG. 3
(PRIOR ART)

LOW SIDE ZENER REFERENCE VOLTAGE EXTENDED DRAIN SCR CLAMPS

FIELD OF THE INVENTION

The invention relates to ESD protection of high voltage devices.

BACKGROUND OF THE INVENTION

In an endeavor to integrate green energy sources such as solar energy into the national grid, and provide cost effective electric car chargers and street lighting, a strong emphasis has been placed on providing an integrated circuit solution for electric car motor drivers, solar energy conversion, and other dc to grid ac conversion applications. This commonly requires voltage ranges of 600 V and above. Grid tolerant circuits for instance are tolerant to 700-1000V. These high voltage devices differ both functionally and structurally from low voltage devices since they need to deal with high voltages during normal operation without triggering as is discussed in greater detail below. High voltage devices have, for instance, been implemented as Lateral DMOS (LDMOS) (which is a self-aligned device implemented in a BiCMOS process) or as drain-extended MOS (DeMOS) (which is a non-self-aligned device implemented in a CMOS process). FIG. 1 shows a cross section through a typical NLDMOS-SCR 100, which broadly speaking comprises an LDMOS having one or more p+ regions 102 which are connected to the drain defined by n+ region 104 to provide for double injection of charge carriers. The n+ drain 104 is formed in an n-well or n-drift region 106, which in this case is formed in an n-epitaxial region 108 formed in or on a p-substrate 110. The device 100 further includes an n+ source 114 formed in a p-body or p-well 116, which is formed in the n-epi 108. In this embodiment the NLDMOS SCR 100 further includes a p+ backgate 118 formed in the p-well 116. A polysilicon gate 120, which is formed over a gate oxide 122 and a field oxide (FOX) 124, is provided between the drain contact 130 and source contact 128 and is located substantially equally spaced between the drain contact 130 and source contact 128. The region between the contacts defines the active region. For convenience during fabrication the p+ region 102 may be self aligned with the FOX region 124. However, even though devices such as the NLDMOS-SCR 100 are operable under normal operating conditions of between 300 and 1000V, the question is what happens to these devices under ESD conditions.

First impressions may suggest that, since very high voltage (VHV) and ultra high voltage (UHV) pins are already designed to accommodate high voltages during normal operation, that it is unnecessary to provide electrostatic discharge (ESD) protection for UHV pins. However, recent evaluations suggest that ESD protection is nevertheless required, especially system level protection in order to withstand the HBM (human body model) ESD pulse mode.

Thus the VHV and UHV devices have to be designed to tolerate the required dc levels during normal operation as well as the triggering voltage range during an ESD event. In the case of switching or noisy high voltage nodes this creates a problem. One solution has been to control the triggering voltage by dynamically coupling the control electrode of the clamp. For instance, as shown in FIG. 2, the gate of an LDSCR clamp 200 has in the past been connected to ground through a resistor 202. However, this can cause unpredictable triggering under different loads. Another form of dynamic coupling of the control electrode is that shown in FIG. 3, in which the gate is connected to a fixed voltage reference such as a zener diode 300 to control the control electrode, as shown in FIG. 3. This keeps the triggering voltage consistent under different loads. However, as is shown in FIG. 3, the Zener diode 300 in this example is tied between the switch pad 302 and the gate of the LDSCR 304. Thus the Zener 300 is tied to a high voltage and provides its voltage reference to the gate with respect to this high voltage. This solution is suitable for BiCMOS processes where the substrate is isolated with proper HV tolerance, but not for CMOS processes with their low breakdown voltage.

The present invention proposes, instead, a solution in which there is no dynamic coupling of the control electrode to a voltage reference, but one in which an SCR structure is internally triggered to enter conductivity modulation mode.

SUMMARY OF THE INVENTION

According to the invention, there is provided a very high or ultra high voltage lateral DMOS-type structure (over 600V), which will be referred to herein simply as a UHV LDMOS device whether or not it is operated under very high or ultra high voltage conditions and whether or not it includes an SCR structure, and which is configured to withstand ESD events. The UHV LDMOS device comprises a central pad defining the drain region, wherein a source region is arranged in a race-track configuration around the pad with striations of alternating n-type and p-type material radiating from the pad. The n-type and p-type regions may be defined by p-type regions formed in an n-well or n-epitaxial region surrounding the drain region. The p-type regions can be implemented in different ways, e.g., as shallow p+ regions, or as in depth p+ region (such as p-sinker, etc.). The n-type and p-type regions may instead be defined by n-type regions formed in an p-well or p-epitaxial region surrounding the drain region. The n-type and p-type striations form a long drift region operable as a super junction between the drain region and the source region. The device may further include a polysilicon gate forming a ring around the radiating n-type and p-type striations, and around the central drain. A p+ emitter is preferably formed around the central drain region, and an n+ ring may, in turn, be formed around the p-type emitter. The p+ emitter is operable to provide triggering current control.

The device, although described as a UHV LDMOS can include structural variations and may include the structural characteristics of an insulated gate bipolar transistor (IGBT) with disconnected drain contact, and can also be implemented using different processes e.g., an LDMOS type device implemented in thin film or membrane technology.

BRIEF DESCRIPTION OF THE DRAWINGS

FIG. 1 is a sectional view through a typical NLDMOS-SCR as known in the art,

FIG. 2 is a schematic circuit diagram of a prior art ESD solution implemented in a BiCMOS process, FIG. 3 is a schematic circuit diagram of another prior art ESD solution implemented in a BiCMOS process.

DETAILED DESCRIPTION OF THE INVENTION

Figure 4:
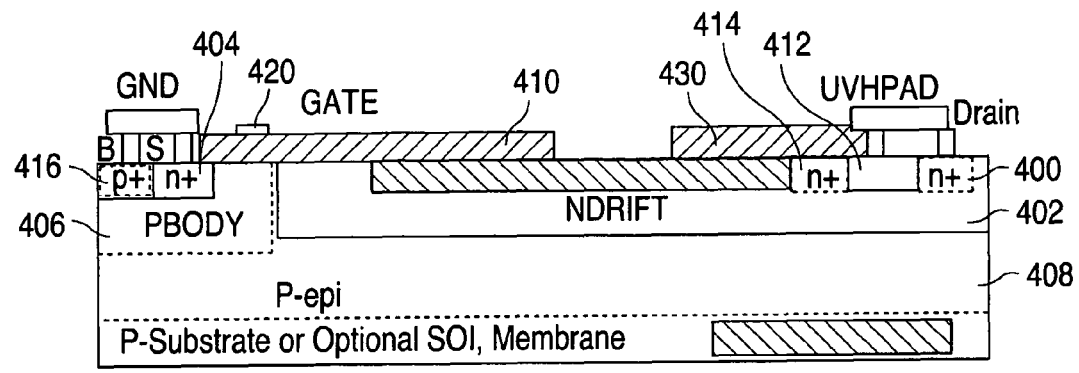
FIG. 4 is a sectional view through one embodiment of an NLDMOS-SCR-like device of the invention.

A typical LDMOS-SCR as known in the art was described above with respect to FIG. 1 with its n+ drain 104 formed in an n-well 106 and n+ source regions 118 formed in a p-well 116. The n-well defines a short drift region extending to underneath the gate poly 120. The device is bounded on either side by an isolation region (not shown).

In contrast to the configuration described above, the LDMOS-SCR-like structure of the invention (that is referred to herein as UHV LDMOS) provides for a symmetrical drift region formed around a central pad defining the drain region of the device. One such embodiment is shown in cross-section in FIG. 4, which shows an n+ drain 400 formed in a long n-drift region 402, which will be discussed in greater detail below. The n+ source 404 is formed in a p-body or p-well 406. The n-drift region 402 and p-body 406 are, in turn formed in a p-epitaxial region 408. A poly gate 410 with gate contact 420 is formed near to the source region, and is spaced from the drain 400 by the long n-drift region 402. This differs from the prior art device in which the gate was substantially uniformly spaced between the drain and source regions. As shown in FIG. 4, a p+ region 412 is formed next to the n+ drain 400 in the n-drift 402, and defines a p+ emitter region. Another n+ region 414 is formed next to the p+ emitter 412 and a polysilicon layer 422 extends over part of the p+ emitter 412 and over the n+ region 414. On the source side, a p+ region 416 is formed next to the n+ source 404 to define a p-body contact. As shown, the p+ region 416 and n+ source 404 are connected to ground, while the n+ emitter 412 and n+ drain 400 are connected to the ultra high voltage pad.

Figure 5:
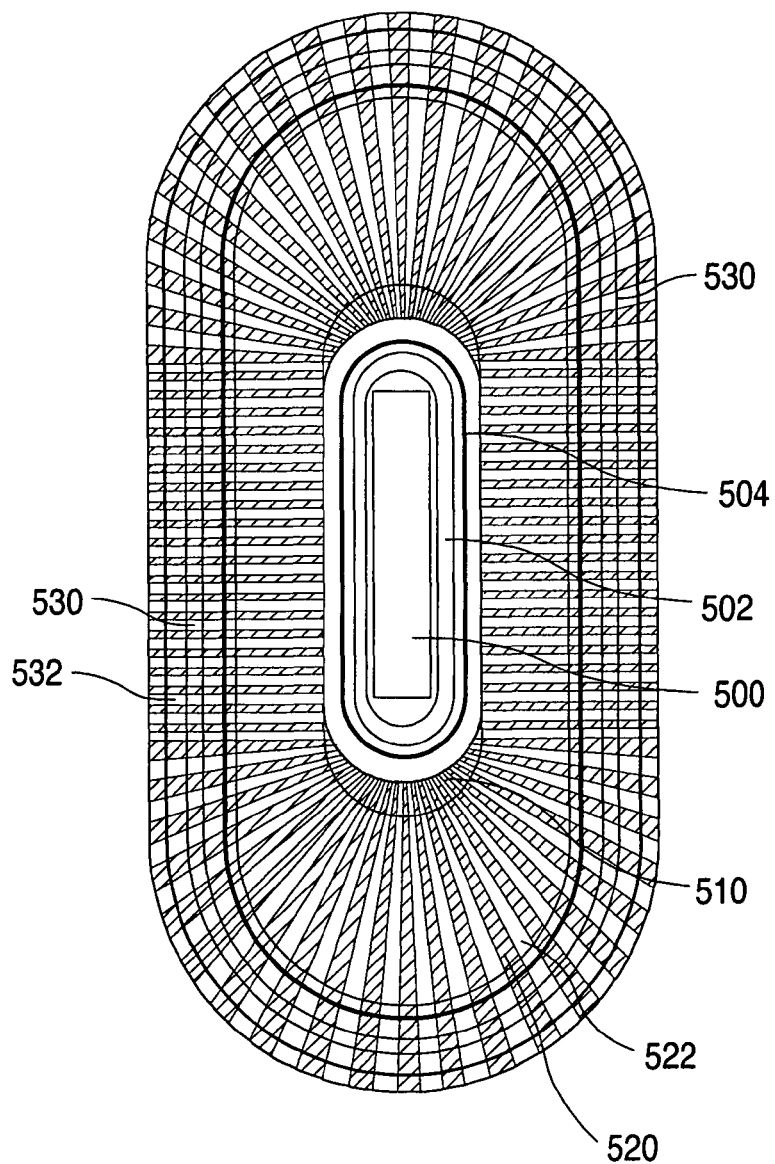
FIG. 5 is a plan view of one embodiment of an NLDMOS-SCR-like structure of the invention.

The other unique features of the LDMOS-SCR-like (UHV LDMOS) structure of the invention, however, are best appreciated when viewing the structure from the top. One such embodiment is shown in FIG. 5, which shows a race-track configuration in which a central n+ drain region 500 is surrounded by a p+ emitter 502 that forms a symmetrical race-track around the n+ drain region 500 to define the UHV pad. An n+ region 504 (similar to the n+ region 414 shown in FIG. 4) extends around the p+ emitter 502, and a polysilicon region 510 extends outwardly from the n+ region 504 and having a wider configuration towards the narrow ends of the race-track. In this embodiment, a drift region is formed making use of multiple n-type and p-type regions 520, 522, respectively to define a super junction. In this embodiment the n-type and p-type regions 520, 522 radiate outwardly from the drain region 500. The n-type and p-type regions 520, 522 may be defined by forming p-type regions in an n-well or n-epitaxial region, in which case the p-type regions can be implemented in different ways, e.g., as shallow p+ regions, or as in depth p+ region (such as p-sinker, etc.). The n-type and p-type regions may instead be defined by n-type regions formed in a p-well or p-epitaxial region surrounding the drain region. In this case the n-type regions can be implemented in different ways, e.g., as shallow n+ regions, or as in depth n+ region (such as n-sinker, etc.)

Similar to the embodiment shown in FIG. 4, which had an n+ source 404 and a p+ region 416 formed in a p-body, with a poly gate 410 extending from the n-source toward the pad, the embodiment of FIG. 5 includes a poly gate 530 under which is formed an n+ source 532, also in race-track configuration. A race-track shaped p+ region 534 extends on the outside of the n+ source 532. The purpose of the multiple n-type and p-type regions 520, 522 is to form multiple reduced surface electric field regions (multi-resurf) to uniformly spread the high electric field emanating from the pad and spread it around the pad thereby accommodating the large voltage difference between the UHV pad at the n+ drain, and the grounded n+ source.

Figure 6:
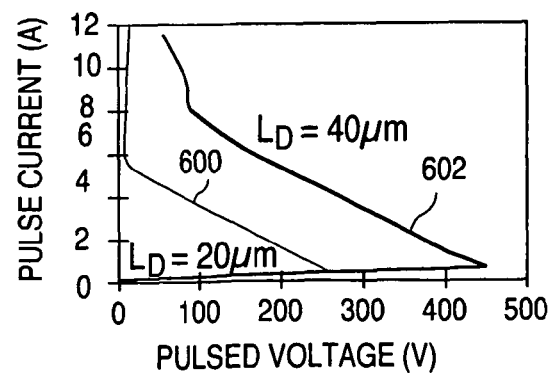
FIG. 6 shows pulsed current vs. pulsed voltage curves for different drift region lengths.

Tests have shown that the reversible TLP characteristics of the device are controlled by the length of the drift region or super junction. For a drift region length LD of 20 µm the snapback is at about 250 V, while for an LD of 40 µm the snapback occurs only at about 450 V, as shown by the curves 600, 602, respectively in FIG. 6. Thus the configuration of the present invention allows high pulsed voltages above the ultra high operating voltage to be protected against through the use of a long uniformly distributed drift region around the UHV pad. A drift region length of approximately 20-50 µm was found to provide good results.

In addition to the long drift region, another feature of the invention is the embedded p+ emitter connected to the pad with some form of junction isolation. In the embodiment of FIG. 4 the junction isolation takes the form of a RESURF plate implemented as a polysilicon layer 430 that helps reduce the surface electric field and avoids local breakdown in the vicinity of the silicide contacts of the p+ emitter 412.

Another feature of the invention is the use of a source RESURF plate in the gate-source region, which in the FIG. 4 embodiment is implemented as a polysilicon layer 410 that helps reduce the surface electric field and avoids local breakdown in the vicinity of the silicide contacts of the n+ source 404.

Figure 7:
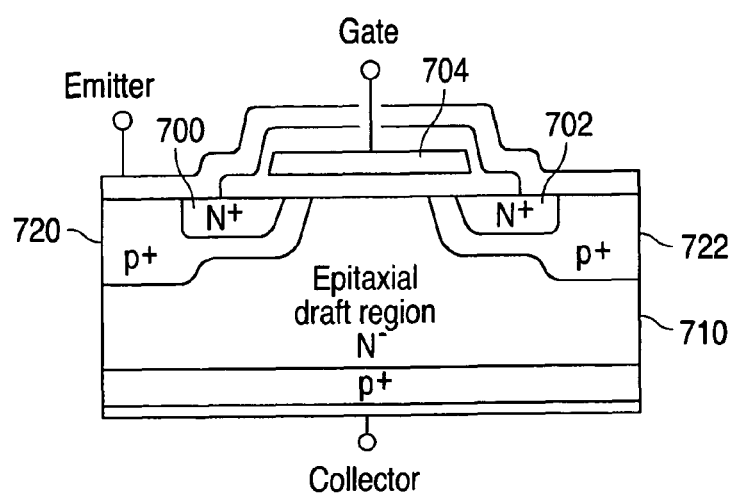
FIG. 7 shows a prior art IGBT.

While the present invention was described with respect to particular embodiments it will be appreciated that the principles of the invention can be implemented in different configurations and making use of different processes. Thus, for example, the p+ emitter region such as the region 412 and the region 502 can be implemented as a shallow p+ region or a deep p+ region such as a p-sinker. The LDMOS-SCR-like device may be implemented on a bulk substrate e.g. by growing an epitaxial layer with a safe operating area (SOA) or forming a lateral device using membrane technology. While the invention was described as an LDMOS-SCR-like device, it includes devices of similar structure such as an insulated gate bipolar transistor (IGBT). A prior art IGBT is shown in FIG. 7 and also includes an n+ drain region 700, an n+ source region 702, a gate 704 located between the drain and source regions, and an n-drift region 710. In accordance with the invention, the relative configurations of the drain and source regions and of the intervening drift region can be implemented as shown for the LDMOS-SCR-like structure of FIG. 5, by making use of a race-track layout with a long drift region that is preferably implemented in alternating striations of n-material and p-material to define a super junction. The n+ drain region 700 in the IGBT is formed in a p+ region 720, which can serve as p+ emitter region, in which case it can be isolated by making use of a RESURF plate similar to the plate 430 discussed above. Similarly the n+ source region 702 is formed in a p+ region 722, which can also be isolated by means of a poly RESURF plate such as the plate 410 discussed with respect to FIG. 4. These aspects of the FIG. 4 embodiment are therefore equally applicable here to the IGBT structure and for purposes of this application the term LDMOS-SCR-like structure includes an IGBT-like structure as discussed above.

It will therefore be appreciated that the present invention provides for a UHV device that is internally triggered into conductivity modulation, and which can be implemented in different ways by making use of one or more combinations of long drift regions, a symmetrical layout and RESURF plates at the silicide contact regions.

What is claimed is:

1. According to the invention, there is provided a very high or ultra high voltage lateral DMOS-type device (UHV LDMOS device), comprising a central pad defining the drain region, a source region arranged in a race-track configuration around the pad with striations of alternating n-type and p-type material radiating from the pad.

2. A device of claim 1, wherein the striations of n-type and p-type material are
defined by p-type regions formed in an n-well or n-epitaxial region surrounding the drain region.

3. A device of claim 2, wherein the p-type regions are implemented in different ways, including as shallow p+ regions, or as in depth p+ region.

4. A device of claim 1, wherein the striations of n-type and p-type material are defined by n-type regions formed in an p-well or p-epitaxial region surrounding the drain region.

5. A device of claim 4, wherein the n-type regions are implemented in different ways, including as shallow n+ regions, or as in depth n+ region.

6. A device of claim 1, wherein the striations of n-type and p-type material form a long drift region operable as a super junction between the drain region and the source region.

7. A device of claim 6, wherein the drift region has a length of 20 μm or more.

8. A device of claim 1, further comprising a racetrack-shaped polysilicon gate forming a ring on the outside of the radiating n-type and p-type striations.

9. A device of claim 8, wherein the drain region comprises a racetrack-shaped n+ drain, the device further comprising a p+ emitter formed around the central n+ drain.

10. A device of claim 9, wherein the source region comprises a racetrack-shaped n+ source.

11. A device of claim 9, further comprising a polysilicon layer formed over the p+ emitter.

12. A device of claim 9, further comprising a polysilicon layer formed over at least part of the n+source.

13. A device of claim 11, further comprising an n+ region extending around the p+ emitter.

14. A device of claim 12, further comprising a p+ region extending around the source.

* * * * *